United States Patent [19]

Koullias

[11] Patent Number: 4,980,651
[45] Date of Patent: Dec. 25, 1990

[54] HIGH SPEED, HIGH PRECISION OPERATIONAL AMPLIFIER

[75] Inventor: Iconomos A. Koullias, West Lawn, Pa.

[73] Assignee: Harris Corporation, Melbourne, Fla.

[21] Appl. No.: 370,280

[22] Filed: Jun. 23, 1989

[51] Int. Cl.$^5$ .............................................. H03F 3/68
[52] U.S. Cl. ..................................... 330/295; 330/126; 330/311
[58] Field of Search .................. 330/124 R, 126, 252, 330/295, 302, 303, 306, 310, 311

[56] References Cited

U.S. PATENT DOCUMENTS 4,095,188 6/1978 Laupman .......................... 330/126 X Primary Examiner—Steven Mottola
Attorney, Agent, or Firm—Evenson, Wands, Edwards, Lenahan & McKeown

[57] ABSTRACT

A DC-coupled multistage operational amplifier, the participation of the multiple stages of which, in defining the effective gain of the amplifier, is frequency dependent, such that high frequency signals are amplified by a single high speed stage and coupled directly to an output port. Low frequency signals, on the other hand, are coupled through both the high speed stage and a low frequency precision stage connected in cascade with the high speed stage. The gains of the respective high speed and low frequency precision amplifier stages are such that amplification of a high frequency input signal applied to an input port is effectively defined by the gain of the high speed first amplifier stage, so that an amplified high ferquency output signal derived from an output port is effectively derived directly from the output of the high speed amplifier stage. On the other hand, amplification of a low frequency input signal applied to the input port is effectively defined by the total gain of a cascaded signal coupling path through each of the high speed and low frequency precision amplifier stages.

8 Claims, 3 Drawing Sheets

HIGH SPEED, HIGH PRECISION OPERATIONAL AMPLIFIER

FIELD OF THE INVENTION

The present invention relates in general to operational amplifier circuits and is particularly directed to a multistage operational amplifier configuration the participation of the multiple stages of which in defining the effective gain of the amplifier is frequency dependent.

BACKGROUND OF THE INVENTION

The design of the circuit architecture of an operational amplifier has been conventionally predicated upon a trade-off between high speed and (low frequency) precision performance. In the former case, the single stage, dominant pole, compensated operational amplifier is capable of achieving maximum possible speed for a given integrated circuit process, but lacks precision due to the limited impedance level that can be attained by a single transimpedance stage, as well as the offset errors induced by reflected mismatch errors from the level-shifting transimpedance and output buffer stage to the input transconductance stage. In the latter case, on the other hand, a two stage, 'pole-splitting', compensated operational amplifier, which is capable of high precision, lacks speed due to the inherent secondary pole, the right-half plane zero and the additional phase shift that results from the extra stage in the signal path.

Attempts to combine high speed and precision components into the same circuit architecture have involved the use of feed-forward techniques (by-pass capacitors) to circumvent the limitations of lateral pnp transistors of which the precision amplifier stage is typically comprised. This approach, however, introduces added complexity to the circuit design and AC coupling into the signal path. For an illustration of these conventional amplifier designs attention may be directed to published articles, such as "High-frequency, CMOS switched-capacitor filters for communications applications", by T.C. Choi et al, IEEE J. Solid-State Circuits, Vol. SC-18, pp. 652-664, Dec. 1983; "An interated NMOS operational amplifier with internal compensation", by Y.P. Tsividis et al, IEEE J. Solid-State Circuits, Vol. SC-11, No. 6, pp. 748-753, Dec. 1976; and "A monolithic fast settling feed-forward op amp using doublet compensation techniques", by R.J. Apfel et al, ISSCC Dig. Tech. Papers, 1974, pp. 134-134.

SUMMARY OF THE INVENTION

In accordance with the present invention, the performance and circuit complexity limitations of conventional operational amplifier architectures, such as those described above, are obviated by a new and improved DC-coupled multistage operational amplifier, the participation of the multiple stages of which, in defining the effective gain of the amplifier, is frequency dependent, such that high frequency signals are amplified by a single high speed stage and coupled directly to an output port. Low frequency signals, on the other hand, are coupled through both the high speed stage and a low frequency precision stage, connected in cascade with the high speed stage. The gains of the respective high speed and low frequency precision amplifier stages are such that amplification of a high frequency input signal applied to an input port is effectively defined by the gain of the high speed first amplifier stage, so that an amplified high frequency output signal derived from an output port is effectively derived directly from the output of the high speed amplifier stage. On the other hand, amplification of a low frequency input signal applied to the input port is effectively defined by the total gain of a cascaded signal coupling path through each of the high speed and low frequency precision amplifier stages.

The transfer function of the operational amplifier contains two primary poles at frequencies below a frequency at which unity gain occurs and a zero at less than the unity gain frequency and greater than the frequencies of the poles. For this purpose, the high speed stage preferably comprises a first transconductance having an input coupled to the input port, a first output coupled to an output port and a second output coupled to an input of the precision amplifier stage, and a first transimpedance coupled between the second output of the first transconductance and a reference potential terminal. The precision amplifier stage comprises a second transconductance having an input coupled to the second output of the first transconductance and an output coupled to the output port, and a second transimpedance coupled between the output of the second transimpedance and the reference potential terminal. Tuning capacitors are coupled to the amplifier stages for setting the frequency response, so that a high frequency input signal that is applied to the input port is effectively amplified by the operation of the first transconductance and the second transimpedance and applied directly to the output port, while a low frequency input signal that is applied to the input port is effectively amplified by a cascaded signal path through the first and second transconductances and the first and second transimpedance and applied to the output port.

DETAILED DESCRIPTION

Figure 1:
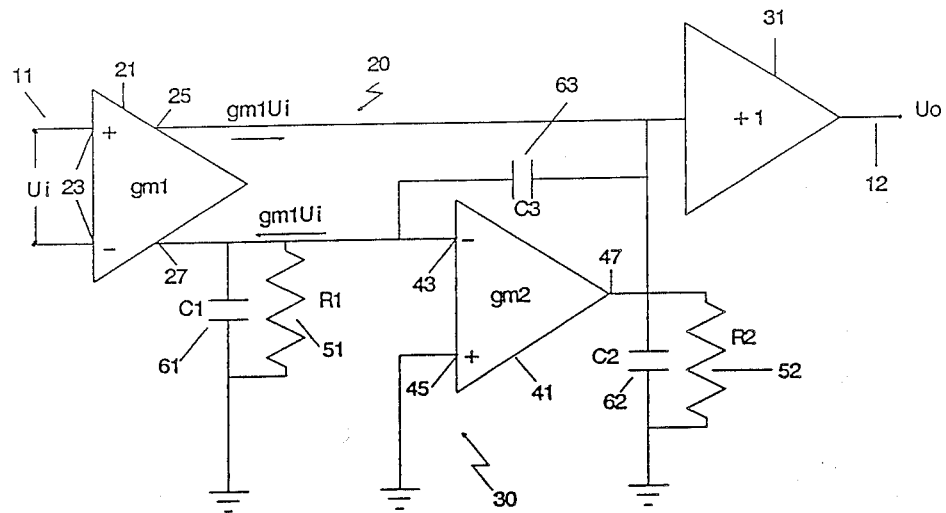
FIG. 1 is a diagrammatical illustration of the multistage architecture of the operational amplifier in accordance with the present invention.

Referring now to FIG. 1, the multistage architecture of the operational amplifier in accordance with the present invention is diagrammatically illustrated as comprising an input port 11, to which an input signal Ui to be amplified is applied, and an output port 12 from which an amplified output signal Uo is derived. Coupled to input port 11 is a first, high speed transconductance (gm1) 21 having a pair of (+ and −) input terminals 23 coupled to input port 11, and a pair of differential outputs 25 and 27, respectively coupled to a downstream, unitygain amplifier 31 from which output port 12 of the operational amplifier is derived, and to a first (+) input 43 of a second, low frequency, precision transconductance (gm2) 41. A second (−) input 45 of transconductance 41 is coupled to a reference terminal (e.g. ground), as shown, while its output 47 is coupled to unity-gain amplifier 31. A first transimpedance 51 is coupled between output 27 of the first transconductance 21 and a reference potential terminal (ground, as shown), while a second transimpedance 52 is coupled between output 47 of the second transconductance 41 and the reference potential terminal (ground). A high frequency by-pass capacitor 61 is coupled in parallel with transimpedance 51 and a stabilizing capacitor 62 is coupled in parallel with transimpedance 52. A third (polesplitting) capacitor 63 is coupled between input 43 and output 47 of transconductance 41.

Figure 1A:
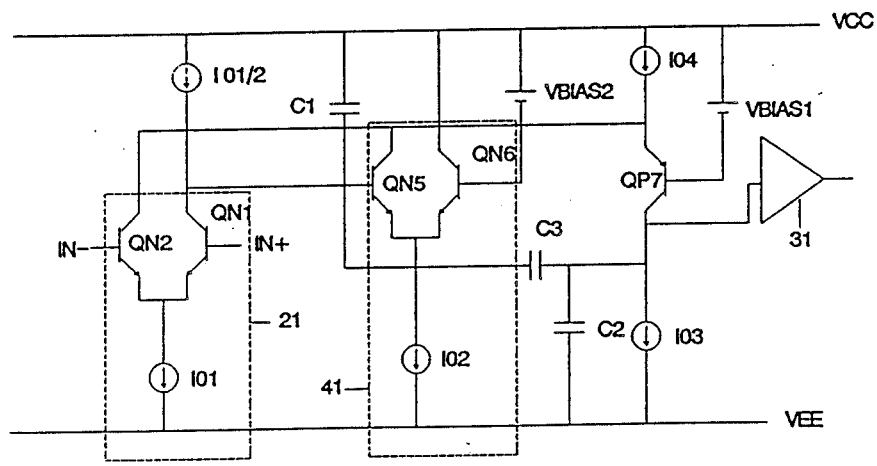
FIG. 1A is a schematic diagram of a bipolar circuit implementation of the multistage operational amplifier diagrammatically shown in FIG. 1.

Referring now to FIG. 1A, there is illustrated a schematic diagram of a bipolar circuit implementation of the operational amplifier shown in FIG. 1. Transconductance 21 is shown as comprising a pair of differentially coupled bipolar transistors QN1 and QN2, the bases of which are coupled to respective IN+ and IN− terminals 23 that form input port 11. The emitters of each of transistors QN1 and QN2 are coupled through a (bipolar transistor configured) current source I01 to bias supply line VEE. Similarly, transconductance 41 comprises a pair of differentially coupled bipolar transistors QN5 and QN6, the emitters of which are coupled through current source I02 to bias supply line VEE. The collector of transistor QN2 is coupled in common with the collector of transistor QN5 and the collector of a transistor QP7, the emitter of which is coupled through current source I03 to bias supply line VEE. Current source I03 corresponds to resistor 52 of FIG. 1.

The collector of transistor QP7 is coupled through current source I04 to bias supply line VCC, while its base is coupled to a bias source VBIAS1. Transistor QP7 effectively operates as a level shifter for the input to amplifier 31. The collector of transistor QN6 is coupled to bias supply line VCC, while its base is coupled to a bias source VBIAS2. The collector of transistor QN1 is coupled through current source I02/2 to bias supply line VCC and to the base of transistor QN5. Current source I01/2 corresponds to resistor 51 of FIG. 1.

A capacitor C1 is connected between the base of transistor QN5 and bias line VCC and corresponds to capacitor 61 of the circuit diagram of FIG. 1. Capacitor C2, which corresponds to capacitor 62 of FIG. 1, is coupled across current source I03, while capacitor C3, which corresponds to capacitor 63 of FIG. 1, is coupled between the base of transistor QN5 and the emitter of transistor QP7.

As explained briefly above, the multistage operational configuration according to the present invention is frequency dependent, such that both high speed operation and low frequency precision performance are achievable. With the parallel/cascade interconnection of the transconductance and transimpedance components shown in FIG. 1, high speed operation is accomplished by a first high speed, dominant pole compensated gain stage 20 comprised of transconductance 21 and transimpedance 52 (gain=gm1R2), while low frequency, precision operation is effected by a second pole-splitting gain stage 30, defined by the cascaded coupling of transconductance 21-transimpedance 51-transconductance 41 and transimpedance 52 (gain=gm1gm2R1R2).

As will be explained in detail below, the sum of capacitors 62 and 63 forms the dominant pole compensation capacitor for the first gain stage 20, while capacitor 63 constitutes the pole-splitting capacitor for gain stage 30. Namely, at low frequencies, the total gain of the operational amplifier is defined by the sum of the gains of the stages 20 and 30. At high frequencies, on the other hand, by-pass capacitor 61 effectively prevents transconductance 41 from participating in the operation of the circuit, so that the gain of the amplifier is established exclusively by gain stage 20. The phase shift through high speed gain stage 20 is considerably less than that through precision gain stage 30, so that the operational amplifier remains stable with frequency in a manner similar to that of a dominant pole compensated stage 20.

Figure 2:
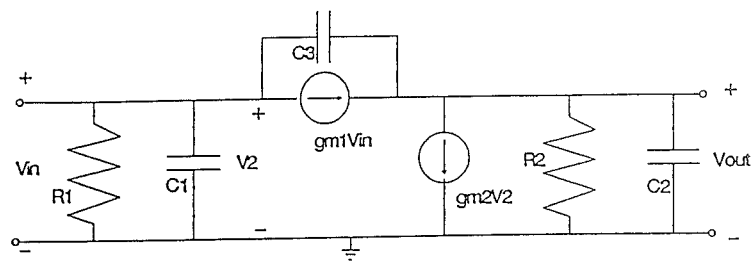
FIG. 2 is a simplified block diagram for carrying out a quantitative analysis of the multistage operational amplifier of the present invention.

The architecture and operation of the multistage operational amplifier according to the present invention may be quantitatively analyzed using the simplified block diagram illustrated in FIG. 2. It should be noted that the simplified block diagram of FIG. 2 does not model the high-frequency poles beyond the unity-gain frequency, so that the direct transfer (DC coupling) of the amplified signal to the output stage is not explicitly quantified.

For DC open-loop gain, transfer function H(s) may be defined as:

$$H(S) = \frac{AOL\left[1 + \frac{1}{gm2R1} + S\frac{C1}{gm2}\right]}{1 + S[R_1(C_1 + C_3) + R_2(C_2 + C_3) + gm_2R_2R_1C_3] + S^2[R_1R_2(C_1C_2 + C_2C_3 + C_1C_3)]} \quad (1)$$

where: $AOL = gm_1R_1 \, gm_2R_2$.

Equation (1) is similar to that obtained from a pole-splitting compensated operational amplifier, but with one important difference: the right-half plane zero has been canceled and a left-half plane zero has been introduced. In accordance with the improved circuit architecture according to the present invention, both the poles and the zero at frequencies are located below the unity-gain frequency and the zero is placed appropriately, so that it will provide unity-gain stability. Also, the second pole is placed close to the frequency of the zero, so that the amplifier will be stable for gains greater than unity.

Figure 3:
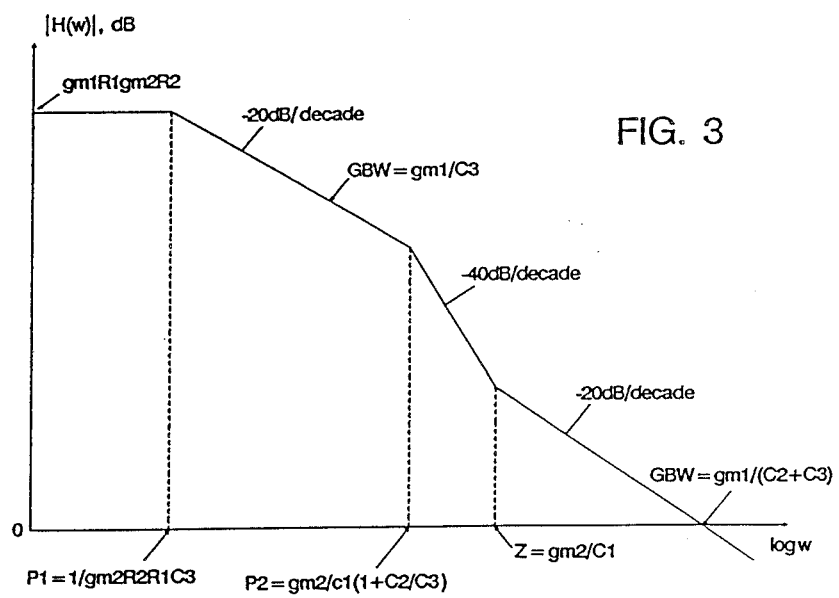
FIG. 3 is a Bode plot of the transfer function of the diagram shown in FIG. 2.

A Bode plot of the magnitude of H(s) is shown in FIG. 3. The dominant pole $P_1$ rolls off the gain with a −20dB/decade slope until the secondary pole $P_2$ occurs, which rolls off the gain with a −40dB/decade slope. The gain assumes the −20dB/decade slope beyond the frequency of the zero until it crosses the unity-gain frequency.

Assuming that the frequency of the secondary pole $P_2$ is more than an order of magnitude higher than the frequency of the dominant pole $P_1$, the denominator of equation (1) is of the form $$\begin{aligned} D(s) &= \left(1 + \frac{S}{p1}\right)\left(1 + \frac{S}{p2}\right) \\ &= 1 + S\left(\frac{1}{p_1} + \frac{1}{p_2}\right) + S^2/p_1p_2 \\ &\approx 1 + \frac{S}{p_1} + \frac{S^2}{p_1p_2} \end{aligned} \quad (2)$$

-continued for $p_2 \gg p_1$

Equation (1) can be rewritten as $$H(S) = \frac{\left(1 + \frac{s}{z}\right)}{\left(1 + \frac{s}{p_1}\right)\left(1 + \frac{s}{p_2}\right)} \simeq \frac{\left(1 + \frac{s}{z}\right)}{1 + \frac{S}{p_1} + \frac{S^2}{p_1 p_2}} \quad (3)$$

From Equations (1) and (3) the frequency of the dominant pole may be defined as:

$$p_1 = \frac{1}{R_1(C_1 + C_3) + R_2(C_2 + C_3) + gm2 R_2 R_1 C_3} \quad (4)$$
$$\simeq \frac{1}{gm2 R_2 R_1 C_3}$$

and the frequency of the secondary pole is $$p_2 = \frac{gm2}{C_2 + C_1\left(1 + \frac{C_2}{C_3}\right)} \quad (5)$$

Since the capacitance C1 of capacitor 61 is deliberately made larger than the capacitance C2 of capacitor 62, so that the secondary pole frequency is lower than the unity-gain frequency, then equation (5) becomes $$p_2 \simeq \frac{gm2}{C_1\left(1 + \frac{C_2}{C_3}\right)} \quad (6)$$

For $gm2 R_2 22 > 1$ the frequency of the zero is given by $$z \simeq \frac{gm2}{C_1} \quad (7)$$

The low frequency gain-bandwidth product GBW is $$GBW (p_1 < w < p_2) = \frac{gm1}{C_3} \quad (8)$$

Where: $w$ = Angular Frequency

The high frequency GBW is equal to the unity-gain frequency and is given by $$wu = GBW(w > z) = GBW(p_1 < w < p_2)\frac{p_2}{z} = \frac{gm1}{C_2 + C_3} \quad (9)$$

From equations (8) and (9), it can be seen that the GBW at low frequencies is higher than the GBW at higher frequencies by a factor of $$P = \frac{GBW(P_1 < W < P_2)}{GBW(w > z)} = \frac{z}{p_2} = 1 + \frac{C_2}{C_3} \quad (10)$$

The importance of the factor P should be noted here. First, in practical integrated circuits, P can be accurately controlled since it is a function of the ratio of capacitors 62 and 63 (C2/C3) rather than the absolute magnitude of a single capacitor. Second, GBW, at the frequencies of interest, is higher than the unity-gain frequency, at which the amplifier must have adequate phase margin, by a factor P. Third, the amplifier slew rate is improved by the same factor P relatively to other amplifiers that have the same unity-gain bandwidth. This is due to the fact that the operational amplifier slew rate is proportional to the low-frequency GBW rather than the unity-gain bandwidth.

The value of P cannot be made very large because the phase of H(S) will approach $-180°$ and therefore will lead to instability for closed loop gains higher than unity. This is due to the fact that large values of P correspond to wider separation between secondary pole P2 and zero z. Since the dominant pole contributes $-90°$ phase shift, the secondary pole will cause the phase to approach $-180°$ before the zero z recovers the phase shift to $-90°$. The phase $\phi$ of H(s) may be calculated from the equation (3) as $$\phi[H(s = jw)] = \arctan \frac{w\left(\frac{1}{p_1} - \frac{1}{z} + \frac{w^2}{z p_1 p_2}\right)}{\frac{w^2}{p_1 p_2} - \frac{w^2}{p_1 z} - 1} \quad (11)$$

For $p_2 \gg p_1$ and $w \gg p_1$ then equation (11) becomes $$\phi[H(s = jw)] = \arctan \frac{\frac{(1 + w^2)}{z p_2}}{w\left(\frac{1}{p_2} - \frac{1}{z}\right)} \quad (12)$$

or $$\phi[H(w)] = \arctan[f(w)] \quad (13)$$

The minimum value of $\phi[H(w)]$ will occur at the frequency wm at which the value of the first derivative of $f(w)$ equals zero $$\frac{df(w)}{dw} = \frac{\frac{w^2}{p_2 z} - 1}{w^2} = 0 \quad (14)$$

from (14)

$$wm = w\left(\frac{df(w)}{dw} = 0\right) = (pz)^{\frac{1}{2}} \quad (15)$$

Therefore, the minimum value of $\phi[H(w)]$ is $$\phi m = \phi[H(w)]\min = \quad (16)$$

$$\phi[H(w = wm)] = \arctan \frac{2}{\left(\frac{z}{p_2}\right)^{\frac{1}{2}} - \left(\frac{p_2}{z}\right)^{\frac{1}{2}}}$$

from equations (16) and (10)

$$\phi m = \arctan \frac{2}{p^{\frac{1}{2}} - p^{-\frac{1}{2}}} \quad (17)$$

For design purposes, equation (17) can be solved for P $$P = 1 + \frac{2}{\tan^2 \phi m} \pm \left[ \left( 1 + \frac{2}{\tan^2 \phi m} \right)^2 - 1 \right]^{\frac{1}{2}} \quad (18)$$

Only the positive sign in equation (18) is used, since $P > 1$. Since, $$\tan \phi m = \tan (\phi m + \pi) \quad (19)$$

then $\phi m$ can be thought as the operational amplifier phase margin at $w = wm$.

Figure 4:
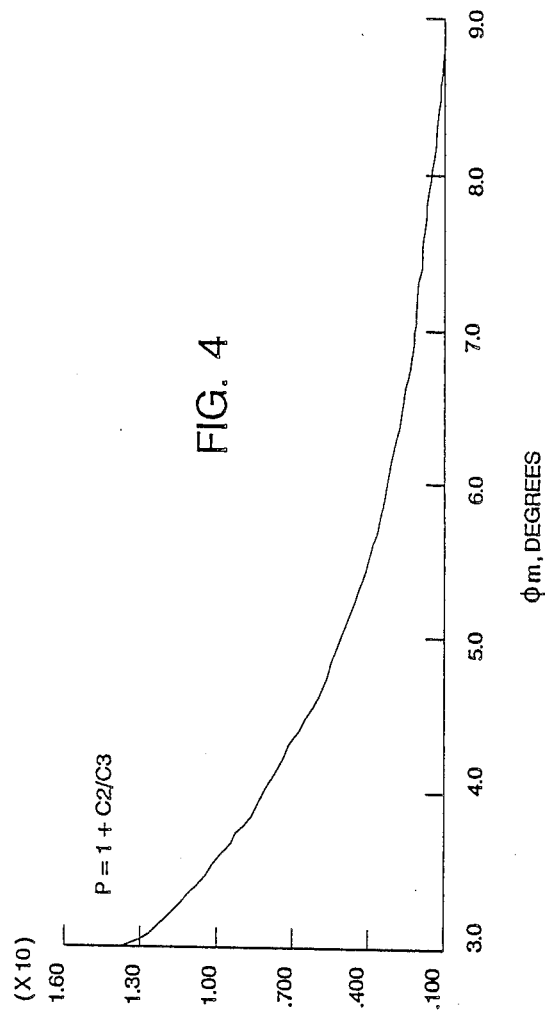
FIG. 4 is a graphical relationship of the variation of improvement factor vs. phase margin of the multistage operational amplifier of the present invention.

FIG. 4 shows the graphical relationship of P to the phase margin $\phi m$.

As an example, a customary design value of the phase margin to be 45° may be considered. Then the improvement factor P is calculated from (18) to be $P = 3 + (8)^{\frac{1}{2}}$ for $\phi m = 45°$ In other words, for a 45° phase margin, the improvement of the GBW product and the slew rate is $3 + (8)^{\frac{1}{2}}(5.8)$.

For a practical implementation design, the phase shift due to higher order poles should also be considered. However, the effect will be small because wm is usually much smaller than the unity gain frequency wu.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. An operational amplifier comprising:
    an input port to which input signals to be amplified are applied;
    an output port from which amplified output signals are derived;
    a first, high speed amplifier stage coupled between said input port and said output port; and
    a second, precision amplifier stage coupled between an output of said first amplifier stage and said output port; and
    wherein the gains of said first and second amplifier stages are such that amplification of a high frequency input signal applied to said input port is effectively defined by the gain of said first amplifier stage, so that an amplified high frequency output signal derived from said output port is effectively derived directly from the output of said first amplifier stage, while amplification of a low frequency input signal applied to said input port is effectively defined by the total gain of a cascaded signal coupling path through each of said first and second amplifier stages and wherein the transfer function of said operational amplifier between said output and input ports contains two primary poles at frequencies below a frequency at which unity gain occurs and a zero at less than the unity gain frequency and greater than the frequencies of the poles.

2. An operational amplifier comprising:
    an input port to which input signals to be amplified are applied;
    an output port from which amplified output signals are derived;
    a first, high speed amplifier stage coupled between said input port and said output port; and
    a second, precision amplifier stage coupled between an output of said first amplifier stage and said output port; and
    wherein the gains of said first and second amplifier stages are such that amplification of a high frequency input signal applied to said input port is effectively defined by the gain of said first amplifier stage, so that an amplifier high frequency output signal derived from said output port is effectively derived directly from the output of said first amplifier stage, while amplification of a low frequency input signal applied to said input port is effectively defined by the total gain of a cascaded signal coupling path through each of said first and second amplifier stages, wherein said first amplifier stage comprises a first transconductance having an input coupled to said input port, a first output coupled to said output port and a second output coupled to an input of said second amplifier stage, and a first transimpedance coupled between the second output of said first transconductance and a reference potential terminal, and wherein
    said second amplifier stage comprises a second transconductance having an input coupled to the second output of said first transconductance and an output coupled to said output port, and a second transimpedance coupled between the output of said second transimpedance and said reference potential terminal.

3. An operational amplifier according to claim 2, further including means, coupled to said first and second amplifier stages, for setting the frequency response thereof, whereby a high frequency input signal that is applied to said input port is effectively amplified by the operation of said first transconductance and said second transimpedance and applied directly to said output port, while a low frequency input signal that is applied to said input port is effectively amplified by a cascaded signal path through said first and second transconductances and said first and second transimpedances and applied to said output port.

4. An operational amplifier according to claim 4, wherein said frequency response setting means comprises a first reactance coupled in circuit with said first transimpedance, a second reactance coupled in circuit with said second transimpedance, and a third reactance coupled in circuit with the input of output of said second transconductance.

5. An operational amplifier according to claim 3, wherein said frequency response setting means comprises a first capacitor coupled in parallel with said first transimpedance, a second capacitor coupled in parallel with said second transimpedance, and a third capacitor coupled between the input and output of said second transconductance.

6. An operational amplifier comprising:
    a first, high speed, transconductance having an input port, to which an input signal to be amplified is applied, and plural output ports;
    a second low speed, high precision, transconductance having an input port coupled to one of the output ports of said first transconductance and an output port from which an amplified output signal is derived and which is coupled to the other of the plural output ports of said first transconductance;

a first transimpedance coupled between said one output port of said first transconductance and a reference potential terminal;

a second transimpedance coupled between the output port of said second transconductance and said reference potential terminal; and means, coupled to said first and second transconductances, for setting the frequency response thereof, whereby a high frequency input signal that is applied to the input port of said first transconductance is effectively amplified by the operation of said first transconductance and said second transimpedance and applied directly to the output port of said second transconductance, while a low frequency input signal that is applied to the input port of said first transconductance is effectively amplified by a cascaded signal path through said first and second transconductances and said first and second transimpedances and applied to the output port of said second transconductance.

7. An operational amplifier according to claim 6, wherein the transfer function of said operational amplifier between the output port of said second transconductance and the input port of said first transconductance contains two primary poles at frequencies below a frequency at which unity gain occurs and a zero at less than the unity gain frequency and greater than the frequencies of the poles.

8. An operational amplifier according to claim 7, wherein said frequency response setting means comprises a first capacitor coupled in parallel with said first transimpedance, a second capacitor coupled in parallel with said second transimpedance, and a third capacitor coupled between the input and output of said second transconductance.

* * * * *